(12) United States Patent
Islam et al.

(10) Patent No.: US 7,439,097 B2
(45) Date of Patent: Oct. 21, 2008

(54) TAPED LEAD FRAMES AND METHODS OF MAKING AND USING THE SAME IN SEMICONDUCTOR PACKAGING

(75) Inventors: Shafidul Islam, Plano, TX (US); Romarico Santos San Antonio, Batam Island (ID); Lenny Christina Gultom, West Java (ID)

(73) Assignee: Unisem (Mauritius) Holdings Limited, Port Louis (MU)

( * ) Notice: Subject to any disclaimer, the term of this patent is extended or adjusted under 35 U.S.C. 154(b) by 312 days.

(21) Appl. No.: 11/155,878

(22) Filed: Jun. 17, 2005

(65) Prior Publication Data

US 2006/0001130 A1    Jan. 5, 2006

Related U.S. Application Data

(63) Continuation of application No. 10/256,288, filed on Sep. 25, 2002, now abandoned.

(51) Int. Cl.
*H01L 21/44* (2006.01)
*H01L 21/48* (2006.01)
*H01L 21/50* (2006.01)

(52) U.S. Cl. .................. 438/106; 438/110; 438/123; 257/E21.499

(58) Field of Classification Search .............. 438/106, 438/110, 111, 113, 123, 124; 257/E21.499
See application file for complete search history.

(56) References Cited

U.S. PATENT DOCUMENTS 4,038,488 A    7/1977    Lin (Continued)

FOREIGN PATENT DOCUMENTS

EP    977251 A1    2/2000

(Continued)

OTHER PUBLICATIONS

International Search Report for PCT/IB03/04632, mailed Mar. 25, 2004.

(Continued)

*Primary Examiner*—Hoai V Pham
(74) *Attorney, Agent, or Firm*—White & Case LLP

(57) ABSTRACT

The invention provides a taped lead frame for use in manufacturing electronic packages. The taped lead frame is composed of a tape and a lead frame formed from a plurality of individual metal features attached to the tape and arranged in a footprint pattern. The method of making the invention enables the thickness of conventional frames to shrink significantly to result in thinner packages for improved heat dissipation and shorter geometries for improved electrical performance. A plurality of such lead frames are arranged in an array on a sheet of tape and each lead frame is separated from surrounding lead frames by street regions on the tape such that no metal feature extends into a street region. Integrated circuit chips are attached and electrically connected to the lead frames and an encapsulant is applied, cured and dried over the lead frames and the street regions. Thereafter, the tape is removed and the lead frames are singulated by cutting through the encapsulant in the street regions to form individual packages. Singulation occurs in the street regions and does not cut into any metal feature forming the lead frame.

7 Claims, 14 Drawing Sheets

U.S. PATENT DOCUMENTS

| | | | |
|---|---|---|---|
| 5,656,550 | A | 8/1997 | Tsuji et al. |
| 5,703,407 | A | 12/1997 | Hori |
| 5,847,458 | A | 12/1998 | Nakamura et al. |
| 5,896,651 | A | 4/1999 | Hawthorne |
| 5,936,303 | A | 8/1999 | Nishi |
| 6,001,671 | A | 12/1999 | Fjelstad |
| 6,054,755 | A | 4/2000 | Takamichi et al. |
| 6,093,584 | A | 7/2000 | Fjelstad |
| 6,143,981 | A | 11/2000 | Glenn |
| 6,232,650 | B1 | 5/2001 | Fujisawa et al. |
| 6,238,952 | B1 | 5/2001 | Lin |
| 6,291,274 | B1 | 9/2001 | Oida et al. |
| 6,294,830 | B1 | 9/2001 | Fjelstad |
| 6,316,727 | B1 | 11/2001 | Liu |
| 6,348,399 | B1 | 2/2002 | Lin |
| 6,355,199 | B1 | 3/2002 | Briar et al. |
| 6,373,140 | B1 | 4/2002 | Onodera et al. |
| 6,451,627 | B1 | 9/2002 | Coffman |
| 6,498,099 | B1 | 12/2002 | McLellan et al. |
| 6,534,849 | B1 | 3/2003 | Gang |
| 6,545,364 | B2 | 4/2003 | Sakamoto et al. |
| 6,545,536 | B1 | 4/2003 | Haczewski et al. |
| 6,576,539 | B1 | 6/2003 | Lin |
| 6,585,905 | B1 | 7/2003 | Fan et al. |
| 6,635,957 | B2 | 10/2003 | Kwan et al. |
| 6,657,293 | B1 | 12/2003 | Fumihira |
| 6,798,121 | B2 | 9/2004 | Nakatani et al. |
| 6,821,821 | B2 | 11/2004 | Fjelstad |
| 6,856,235 | B2 | 2/2005 | Fjelstad |
| 6,872,661 | B1 | 3/2005 | Kwan et al. |
| 6,906,423 | B1 | 6/2005 | Asakawa et al. |
| 6,933,594 | B2 | 8/2005 | McLellan et al. |
| 6,989,294 | B1 | 1/2006 | McLellan et al. |
| 6,995,460 | B1 | 2/2006 | McLellan et al. |
| 7,144,800 | B2 * | 12/2006 | Mostafazadeh et al. ..... 438/598 |
| 2001/0020546 | A1 | 9/2001 | Eldridge et al. |
| 2001/0045625 | A1 | 11/2001 | Sakamoto et al. |
| 2001/0045640 | A1 | 11/2001 | Oida et al. |
| 2001/0050370 | A1 | 12/2001 | Sakamoto et al. |
| 2001/0052600 | A1 | 12/2001 | Sakamoto et al. |
| 2002/0027010 | A1 | 3/2002 | Glenn |
| 2002/0041019 | A1 | 4/2002 | Gang |
| 2002/0048948 | A1 | 4/2002 | Gang |
| 2002/0053745 | A1 | 5/2002 | Lin |
| 2002/0089053 | A1 | 7/2002 | Liu et al. |
| 2002/0105069 | A1 | 8/2002 | Kawahara et al. |
| 2002/0159242 | A1 | 10/2002 | Nakatani et al. |
| 2003/0127711 | A1 | 7/2003 | Kawai |
| 2003/0170922 | A1 | 9/2003 | Sakamoto et al. |

FOREIGN PATENT DOCUMENTS

| | | |
|---|---|---|
| EP | 1162669 | 12/2001 |
| EP | 1189272 A | 3/2002 |
| JP | 11-186294 | 7/1999 |
| JP | 11-195742 A | 10/1999 |
| JP | 2000-150760 | 5/2000 |
| JP | 2000-266737 | 9/2000 |
| JP | 2001-127199 | 5/2001 |
| JP | 2002-076245 | 3/2002 |
| JP | 2002-076246 | 3/2002 |
| KR | 2001-0008926 | 2/2001 |
| TW | 464053 | 11/2001 |
| WO | WO-03-103038 A1 | 12/2003 |
| WO | WO-2004-064144 A2 | 7/2004 |
| WO | WO-2004-030030 A2 | 8/2004 |
| WO | 2008/057770 | 5/2008 |

OTHER PUBLICATIONS

Written Opinion for PCT/IB03/04632, mailed Jun. 23, 2004.
International Preliminary Examination Report for PCT/IB03/04632, completed Dec. 15, 2004.
International Search Report for PCT/US03/13046, mailed Sep. 23, 2003.
Written Opinion for PCT/US03/13046, mailed Feb. 25, 2004.
International Preliminary Examination Report for PCT/US03/13046, completed May 27, 2004.
International Search Report for PCT/GB04/00123, mailed Sep. 30, 2004.
Written Opinion for PCT/GB04/00123, mailed Sep. 30, 2004.
International Preliminary Examination Report for PCT/GB04/00123, completed Jan. 20, 2005.
International Search Report and Written Opinion dated Apr. 22, 2008 cited in application No. PCT/US2007/082423.
European Examination Report dated Apr. 4, 2008 issued in European appln. 03748499.5.

* cited by examiner

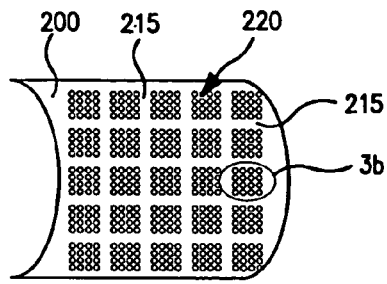
FIG. 3a
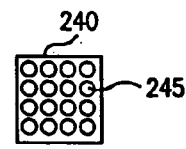
FIG. 3d
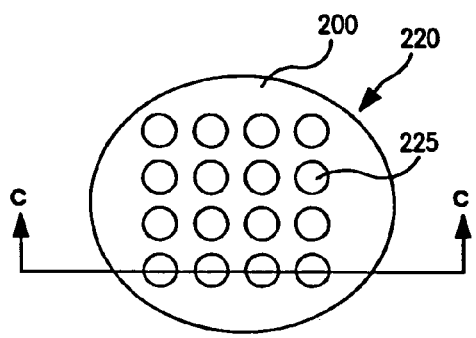
FIG. 3b
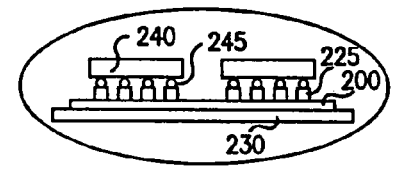
FIG. 3e
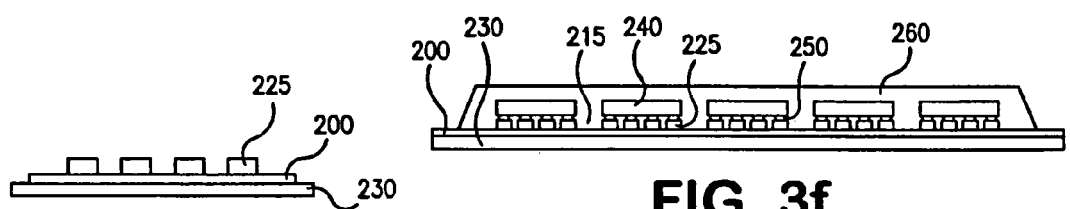
FIG. 3c
FIG. 3f
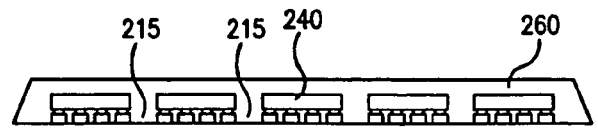
FIG. 3g

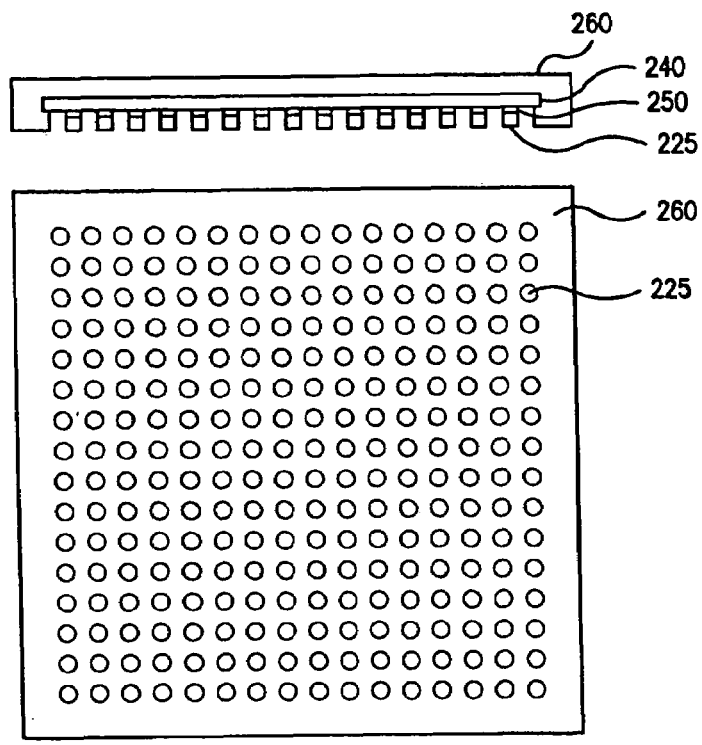
FIG. 3k
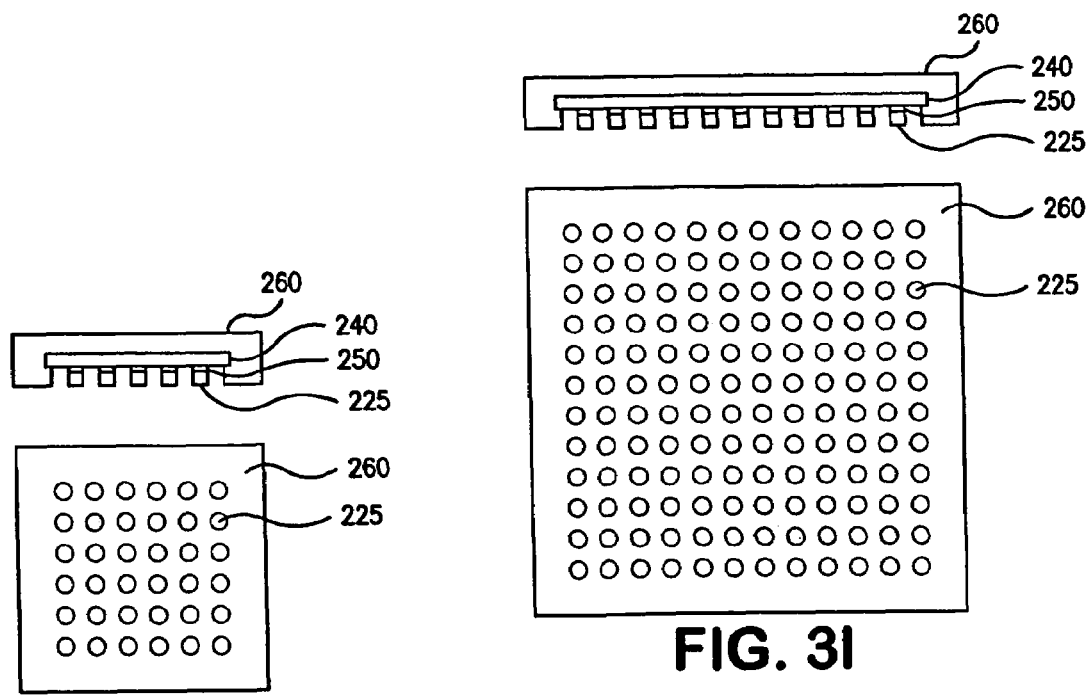
FIG. 3l
FIG. 3m

TAPED LEAD FRAMES AND METHODS OF MAKING AND USING THE SAME IN SEMICONDUCTOR PACKAGING

This application is a continuation of U.S. patent application Ser. No. 10/256,288, filed Sep. 25, 2002 now abandoned.

FIELD OF THE INVENTION

The present invention generally concerns lead frames and the use thereof in the manufacture of packages containing electronic components. In particular, the invention concerns a taped lead frame and a method for making and using the same in creating semiconductor electronic packages.

BACKGROUND OF THE INVENTION

Lead frames are typically made by etching or stamping a metal film to specific shapes and dimensions. Finely configured lead frames often resemble very delicate embroidery, or stencil-like metal structures. Such conventional lead frames are used in the industry to create a variety of chip packages, including wire bonded and flip-chip packages.

Conventional lead frames lack structural rigidity. The finger-like portions of lead frames are quite flimsy and difficult to hold in position during processing. This leads to handling flaws, damage and distortion during assembly processing.

In automated processes for making chip size packages, manufacturers typically form a plurality of interconnected lead frames in a block matrix, attach and electrically connect chips to each lead frame in the block, encapsulate the chip/lead frames, back etch the metal between the contacts of each lead frame and then saw singulate each chip/lead frame to form individual packages. In conventional processes, however, the lead frames in the block are interconnected to one another until the singulation step. During the process of singulating, the thickness of the saw blade cuts not only through the encapsulant plastic, but also through the metal connections that hold the lead frames together in the block. The force and vibration of the saw blade places undue stress on the attachment and electrical connection between the chips and the lead frames. This can lead to structural defects, such as delamination at the metal-plastic interfaces. The present invention overcomes these problems.

SUMMARY OF THE INVENTION

The present invention provides a taped lead frame for use in electronic packaging. The invention comprises etched metal features attached to a disposable tape or carrier that forms lead frame outlines in a footprint pattern. The tape or carrier may hold the metal features representing final form of a lead frame outline by lamination, adhesive or other suitable method. The metal features of the lead frame provide support and electrical connection to an integrated circuit chip. In the lead frame of the invention, each metal feature is electrically isolated from the other metal features in the pattern in the final form used in an individual component or package. This invention also provides the methods of making the metal features of the lead frame on a tape or carrier. The methods include attaching a tape or a film or carrier to a metal film or layer that forms the lead frame features for individual packages, or, patterning a metal film to leave the required set of isolated metal features to form a metal lead frame. Alternatively, screen printing thick metal film of even thickness onto a disposable tape, film, including glass film, or other carrier equivalents is considered to achieve the same formation.

The invention also concerns a method of forming an electronic package using a lead frame according to the invention. The method comprises providing a lead frame according to the invention and attaching and electrically connecting an integrated circuit chip to the metal features of the lead frame. An encapsulant is then applied over the lead frame on the tape and cured. The tape is removed and the encapsulated embodiment with lead frame metal features securely embedded is singulated without touching any of the isolated metal features by design to form an electronic package.

In a preferred embodiment, a plurality of taped lead frames according to the invention is formed in an array for mass producing electronic packages. In this embodiment the plurality of individual metal lead frames are attached to a sheet of the tape. Each lead frame is separated from adjacent lead frames by street regions on the tape. The individual metal features arranged in a footprint pattern forming each lead frame are electrically isolated from one another and no metal feature extends into a street region.

A plurality of electronic packages may be formed using the array of taped lead frames. In this method, a plurality of integrated circuit chips are attached and electrically connected to each lead frame on the array. Thereafter, an encapsulant is applied over the lead frames and the street regions on the tape. In one embodiment, the encapsulating step includes applying the encapsulant material over the lead frame in a controlled manner to flow around the metal features and up to the tape surface without creating any mold flash.

Once the encapsulant is cured and dried, the tape is removed. Because the lead frames are electrically isolated from one another, "strip" testing may be performed at this stage, prior to singulation. The array is then singulated through the encapsulant in the street regions to form individual electronic packages. Singulating can be accomplished by sawing, laser cutting, water jet cutting or a combination thereof.

The invention further includes a number of optional features. For example, a wire-bondable and solderable composition may be pre-plated on either or both a first and second surface of each metal feature. The wire-bondable and solderable composition may be Ni—Pd—Au-strike.

The metal features may have a thickness of about 1-4 mils or may be less than 1 mil. The tape is made of a disposable and low-cost plastic material, for example, POLYIMIDE, MYLAR, KAPTON, or Fr-4 or alternatively an equivalent carrier that can be removed or disposed like glass-film or shiny plastic film or similar. The tape or alternative carrier may be removed by peeling, dissolving or back patterning. In addition, a stiffener may be incorporated below the lower surface of the tape to provide additional support and rigidity during processing. Where a stiffener is used, it is removed prior to removing the tape during the process.

The metal features may be constructed and arranged in a variety of footprint patterns to accommodate the particular package being manufactured. For example, the metal features may be constructed for wire-bonding processing to include a die pad for supporting an integrated circuit chip and lead contacts for electrically connecting the lead frame to the chip. Alternatively, the metal features may be constructed for flip-chip or land grid array processing to provide lead contacts for both supporting an integrated circuit chip and for electrically connecting the lead frame to the chip.

BRIEF DESCRIPTION OF THE DRAWINGS

FIG. 3a is top view of a taped lead frame having a plurality of chip sites to accommodate land grid array flip-chips, according to the present invention.

FIG. 3b is a top view of a taped lead frame chip site showing patterned contact features, according to the present invention.

FIG. 3c is a cross-sectional view taken along lines C-C of FIG. 3b, where the tape and the optional stiffener are also shown, according to the present invention.

FIG. 3d is a bottom view of an integrated circuit chip with land grid array solder bumps, according to the present invention.

FIG. 3e is a cross-sectional view showing the placement of two flip-chips of FIG. 3d on two chip sites at the start of the solder flow process for the land grid array bumps, according to the present invention.

FIG. 3f shows the partial collapse of the solder bumps of FIG. 3e after the solder flow process and the encapsulation of the leads, including the flip-chips, into a block of a molding material, according to the present invention.

FIG. 3g is a cross-sectional view showing the removal of the tape and the stiffener from the block of lead frames of FIG. 3f, according to the present invention.

FIG. 3k shows a cross-sectional view as well as a bottom view of a TLGA package having 256 lands, according to the present invention.

FIG. 3l shows a cross-sectional view as well as a bottom view of a TLGA package having 144 lands, according to the present invention.

FIG. 3m shows a cross-sectional as well as a bottom view of a TLGA package having 36 lands, according to the present invention.

DETAILED DESCRIPTION

Figure 1A:
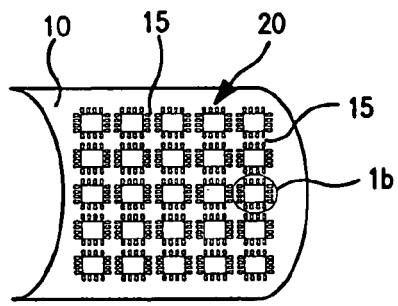
FIG. 1a is top view of a taped lead frame having a plurality of chip sites, according to the present invention.
Figure 1D:
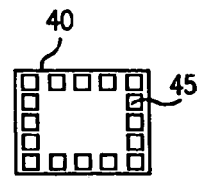
FIG. 1d is a bottom view of an integrated circuit chip showing wire bonding pads.
Figure 1B:
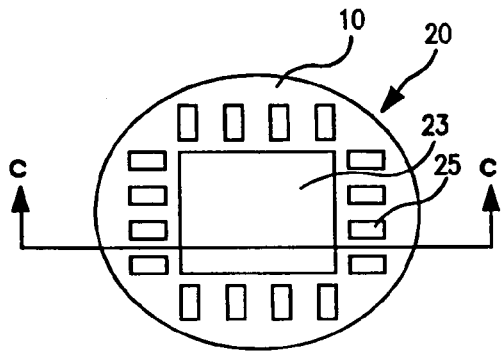
FIG. 1b is a top view of a taped lead frame chip site showing patterned features, including a chip pad and contacts surrounding the chip pad, according to the present invention.
Figure 1E:
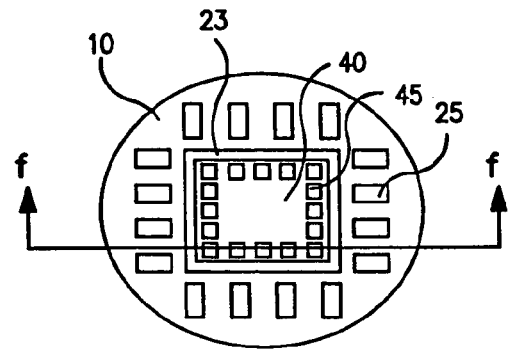
FIG. 1e is a top view of the placement of the chip of FIG. 1d onto the chip pad of FIG. 1b, according to the present invention.
Figure 1C:
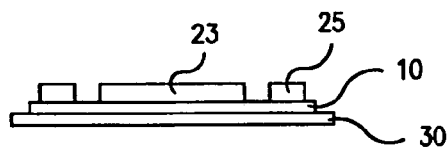
FIG. 1c is a cross-sectional view of the chip site taken along lines C-C in FIG. 1b.
Figure 1F:
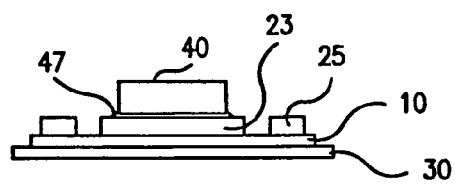
FIG. 1f is a cross-sectional view taken along lines F-F of FIG. 1e showing the back-bonding of the chip of FIG. 1d onto the chip pad, according to the present invention.
Figure 1G:
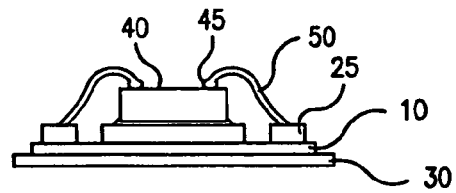
FIG. 1g is a cross-sectional view showing the wire bonding of the chip pads to the electrical contacts of the taped lead frame, according to the present invention.
Figure 1H:
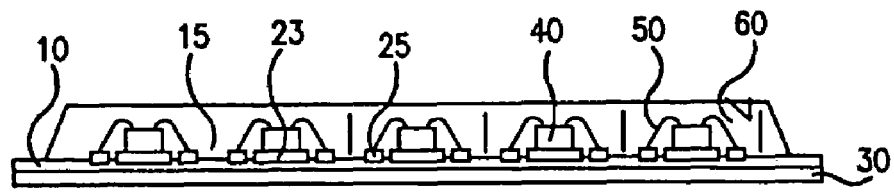
FIG. 1h is a cross-sectional view showing the encapsulation of several taped lead frames, including the chips and the wire bonds, to form a block, according to the present invention.
Figure 1I:
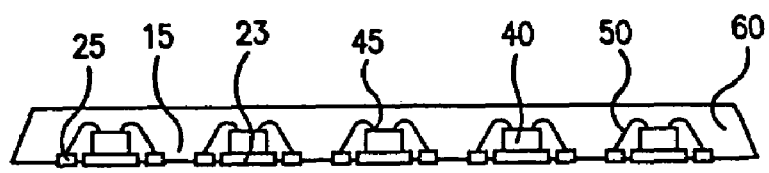
FIG. 1i is a cross-sectional view showing the removal of the tape and the stiffener from the block of lead frames of FIG. 1h, according to the present invention.
Figure 1J:
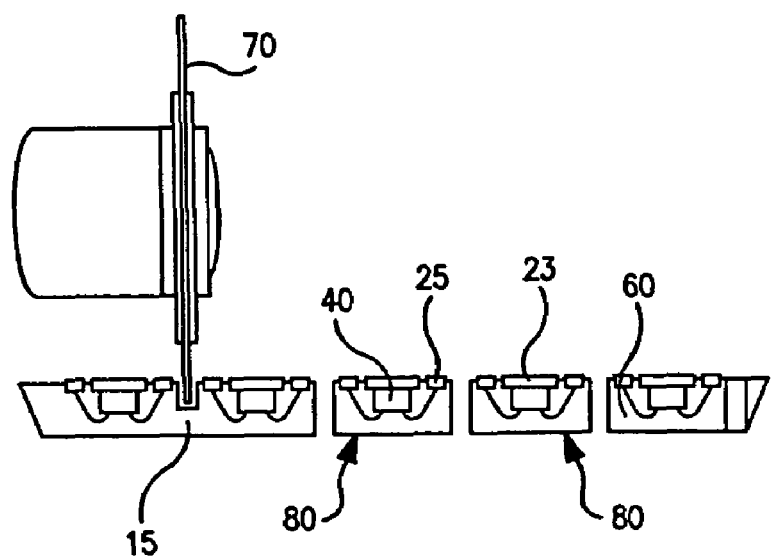
FIG. 1j is a cross-sectional view showing the singulation of the block of FIG. 1i where the saw does not encounter any metal portions of the taped lead frame in the streets, according to the present invention.
Figure 1K:
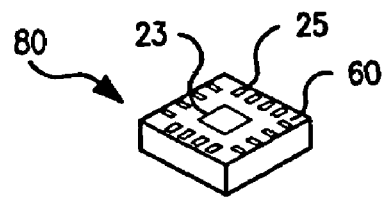
FIG. 1k shows a singulated taped lead frame package, according to the present invention.
Figure 1L:
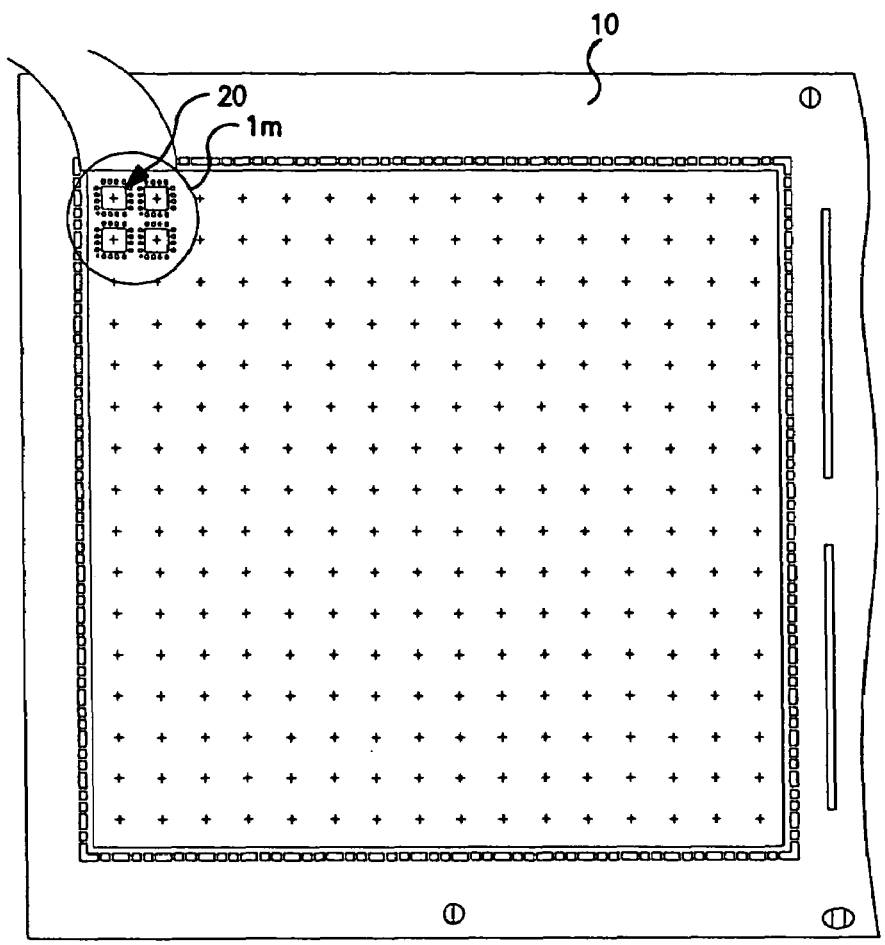
FIG. 1l is a top view of an array, or block, of taped lead frame chip sites, according to the present invention.
Figure 1M:
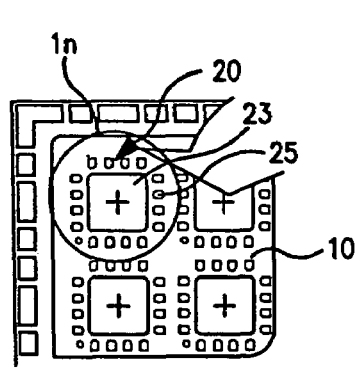
FIG. 1m is a portion of FIG. 1l, showing a better view of a plurality of chip sites, according to the present invention.
Figure 1N:
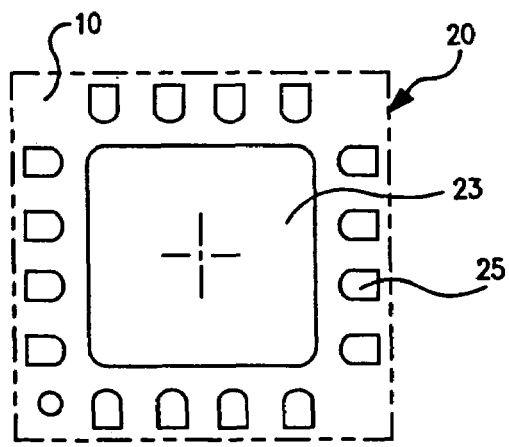
FIG. 1n is a further portion of FIG. 1m, showing a detailed top view of a chip site, according to the present invention.
Figure 1O:
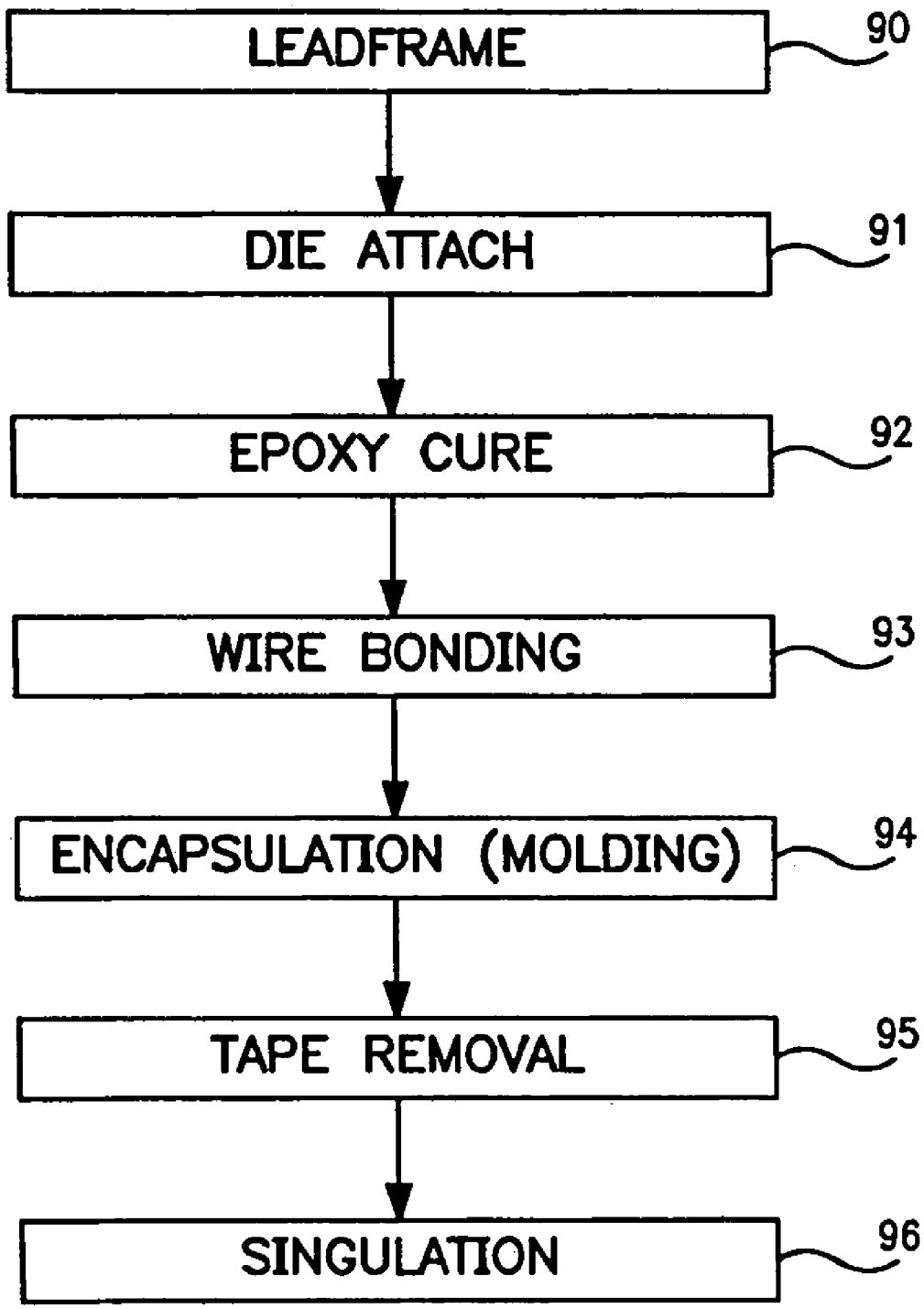
FIG. 1o is a flow chart showing the forming of a taped lead frame package, according to the present invention.

FIGS. 1*a*-1*o* show the forming of an array of taped lead frames for a wire-bonded chip and a method of using the same for forming a taped lead frame package. In a top view shown in FIG. 1*a*, a strip of metal film is attached to tape (10). The attachment of the tape to the metal film can be accomplished in a number of ways, including conventional lamination techniques, or using an adhesive. Alternatively, a metal film can be screen printed onto a disposable tape or film, including glass film carrier to achieve a thinner package. The metal film is then patterned to form an array of lead frames (20) with each metal feature as shown in FIG. 1*a*. As shown in FIGS. 1*b* and 1*c*, each lead frame comprises a plurality of metal features including chip pad (23) and a set of lead contacts (25) surrounding the chip pad. The areas comprising features of the chip pad (23) and lead contacts (25) is collectively referred to as a chip site. A stiffener (30) optionally may be disposed on the lower surface of the tape to provide additional mechanical stability during processing.

The tape (10) comprises a plastic material, such as POLYIMIDE, MYLAR, KAPTON, or Fr-4, and may vary in thickness according to the application. The metal film, preferably copper or a copper alloy, may have a thickness between about 1 to 4 mils, but may also have a thickness less than 1 mil. The metal film can be made as thin as possible, such as by screening, as long as the metal is bondable. It is also preferred that the metal film is pre-plated, prior to mounting it onto the tape, with a wire-bondable and solderable composition comprising Ni—Pd—Au-strike.

One approach to patterning can be stamping the pattern into the metal. Other approaches may include chemical or electrochemical milling and electrical discharge machining. Photolithographic etching is preferred. The etching of the metal is performed until reaching the tape surface. Furthermore, the etching removes all the metal in between the features, and in between the lead frames because, the remaining metal features are held in position by the underlying tape. Spaces devoid of metal between the lead frames are referred to as "streets" (15) as shown in FIGS. 1*a*, 1*h*, and 1*j*.

The tape shown in FIG. 1*a*, serving also as a carrier, advances to the next process step where chips are mounted onto the chip pads of the lead frames. A flex tape along with a single-sided metal film can easily accommodate the conventional reel-to-reel assembly lines. At the next assembly line station, then, chips (40) as shown in FIG. 1*d*, are mounted onto the chip pads. FIG. 1*e* shows a chip site where chip (40) is back-bonded, onto chip pad (23). The back bonding may be accomplished using epoxy (47) and through the use of solders or other eutectic metals in paste or film form. After the epoxy cures, chip pad contacts (45) and lead contacts (25) are electrically connected by wires (50) using wire-bonding techniques, as shown in FIG. 1*g*. Because the lead frames formed according to the present invention have a continuous tape backing, contacts (25) are firmly seated and held down on a flat surface, thereby yielding excellent bonds, which improves the reliability of the end product.

As shown in FIG. 1*h*, after the chips and the corresponding electronic contacts are connected to one another, all the components on the front side of the metal film and tape are covered with an encapsulant molding material (60), such as a resin. Encapsulant (60) is formed over the metal film and all exposed surfaces, including the lead frames and their associated wires (50), chips (40), contacts (125) and over the street regions (15) of the tape. With the disclosed method, the presence of the tape prevents the commonly encountered problem of mold flashing to the footprint on the underside of the package.

FIG. 1*i* shows that the tape (10) and optional stiffener (30) are then removed. The tape may be removed by simply peeling it off or by dissolving it in a chemical solution. The resultant structure is an array, or matrix, of lead frame packages formed into a block. The block is then singulated at the street portions (15) into a plurality of electronic packages (80) as shown in FIG. 1*j*. Singulation can be accomplished in a number of ways, including saw slicing shown in FIG. 1*j*, water-jet-cut, laser-cut, or a combination thereof, or other techniques that are especially suitable for cutting plastics. The bottom surface of each singulated package, shown in FIG. 1*k*, is clean and ready for further processing. The pre-plated contacts can be connected to the next level of packaging. If desired, the already clean contacts can be further smoothed out or flash soldered for improved connections.

A block of lead frames can be of any size commensurate with the desired productivity on the manufacturing line. A top view of such a block is shown in FIG. 1*l*. A portion of the block is shown in FIG. 1*m*, while a chip site is shown in FIG. 1*n*. A summary of the process steps for forming a taped lead frame package of the invention is summarized in FIG. 10. Preferred steps include forming a lead frame chip site (90), followed by chip, or die, attach. The attachment is performed through the use of solder, other eutectic metals or by an epoxy which then is cured and dried at step (92). Next, chip terminals are wire-bonded to lead contacts in step (93), which is followed by encapsulation in a molding material (94). Next, tape is removed at step (95) after which, the molded block is singulated (96) to form the individual packages.

Figure 2A:
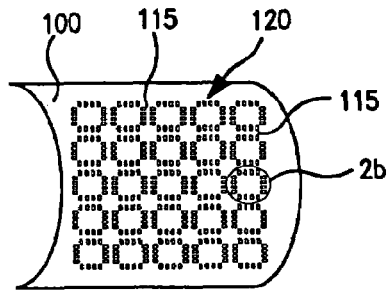
FIG. 2a is top view of a taped lead frame having a plurality of chip sites to accommodate flip-chips, according to the present invention.
Figure 2B:
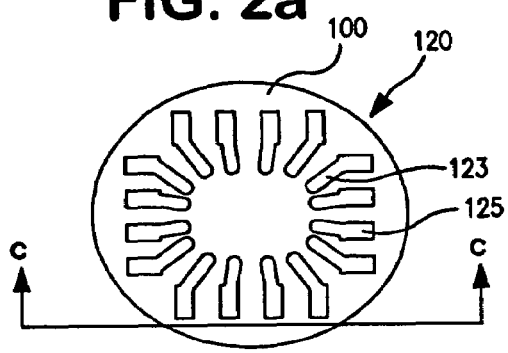
FIG. 2b is a top view of a taped lead frame chip site showing patterned features, including contacts to accept a flip-chip, according to the present invention.
Figure 2C:
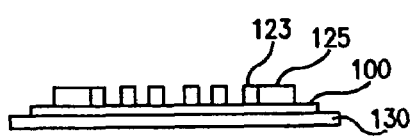
FIG. 2c is a cross-sectional view taken along lines C-C of the chip site of FIG. 2b, where the tape and the optional stiffener are also shown, according to the present invention.
Figure 2D:
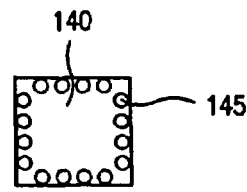
FIG. 2d is a bottom view of an integrated circuit chip with solder bumps, according to the present invention.
Figure 2E:
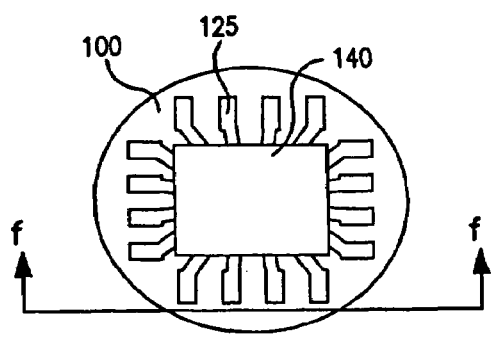
FIG. 2e is a top view of the flip-chip placement of the chip of FIG. 2d onto the electrical contacts of the taped lead frame, according to the present invention.
Figure 2F:
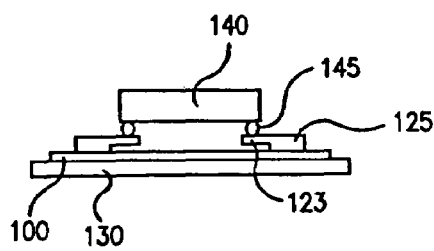
FIG. 2f is a cross-sectional view taken along lines F-F of FIG. 2e showing the start of the solder flow process of the bumps, according to the present invention.
Figure 2G:
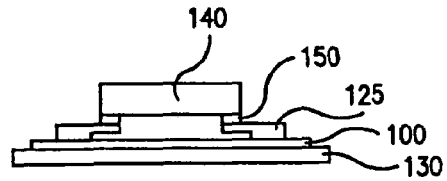
FIG. 2g is a cross-sectional view showing the partial collapse of the solder bumps of FIG. 2f after the solder flow process for the flip-chip, according to the present invention.
Figure 2H:
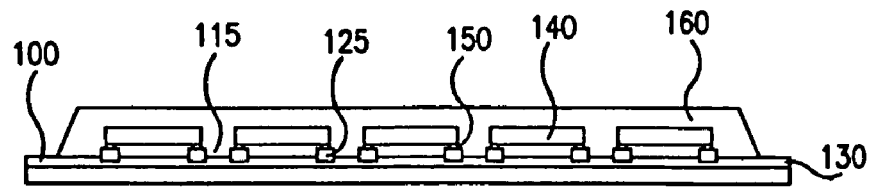
FIG. 2h is a cross-sectional view showing the encapsulation of several taped lead frames, including the chips and the contacts, according to the present invention.
Figure 2I:
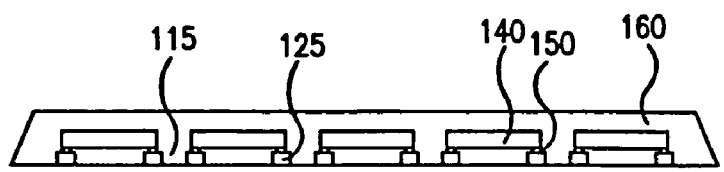
FIG. 2i is a cross-sectional view showing the removal of the tape and the stiffener from the block of lead frames of FIG. 2h, according to the present invention.
Figure 2J:
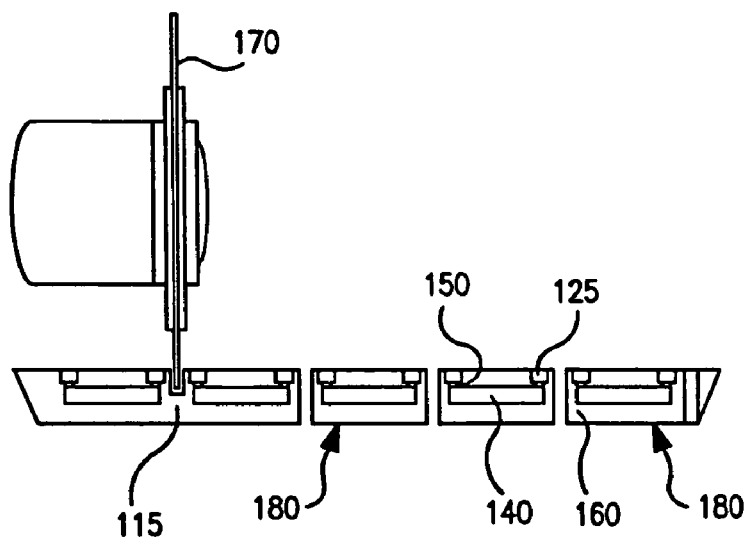
FIG. 2j is a cross-sectional view showing the singulation of the block of FIG. 2i where the saw does not encounter any metal portions of the taped lead frame in the streets, according to the present invention.
Figure 2K:
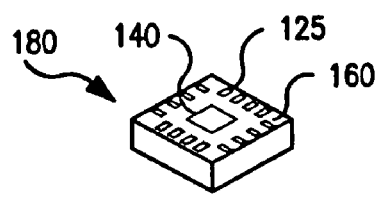
FIG. 2k shows a singulated taped lead frame package with a flip-chip, according to the present invention.
Figure 2L:
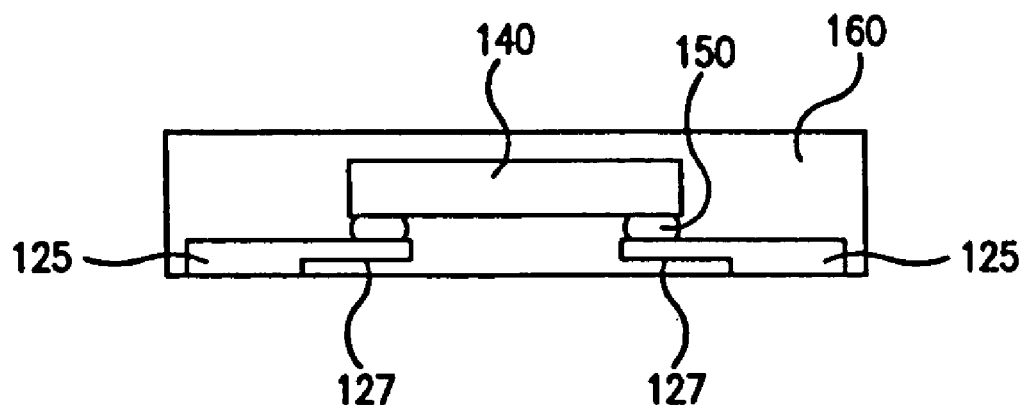
FIG. 2l is a cross-sectional view of a flip chip package showing the lips formed under the contacts, according to the present invention.
Figure 2M:
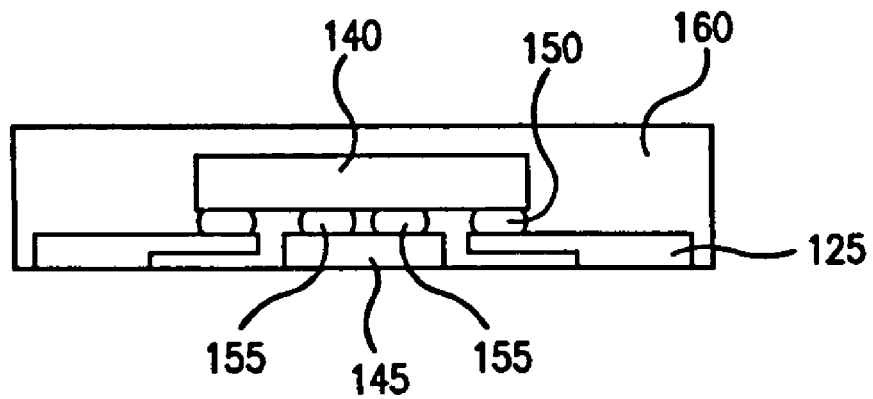
FIG. 2m is a cross-sectional view of a thermally enhanced flip chip package, according to the present invention.
Figure 2N:
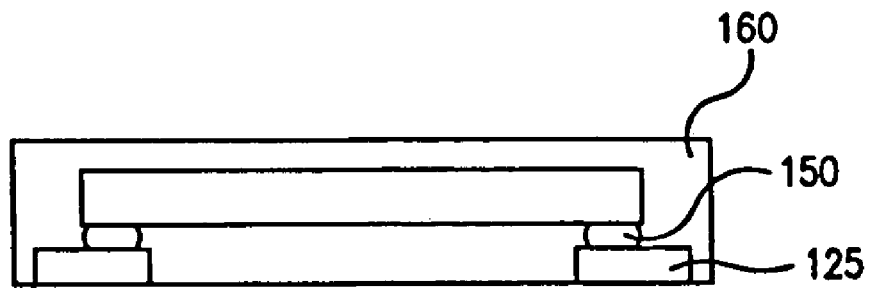
FIG. 2n is a cross-sectional view of a near-chip size flip chip package, according to the present invention.
Figure 2O:
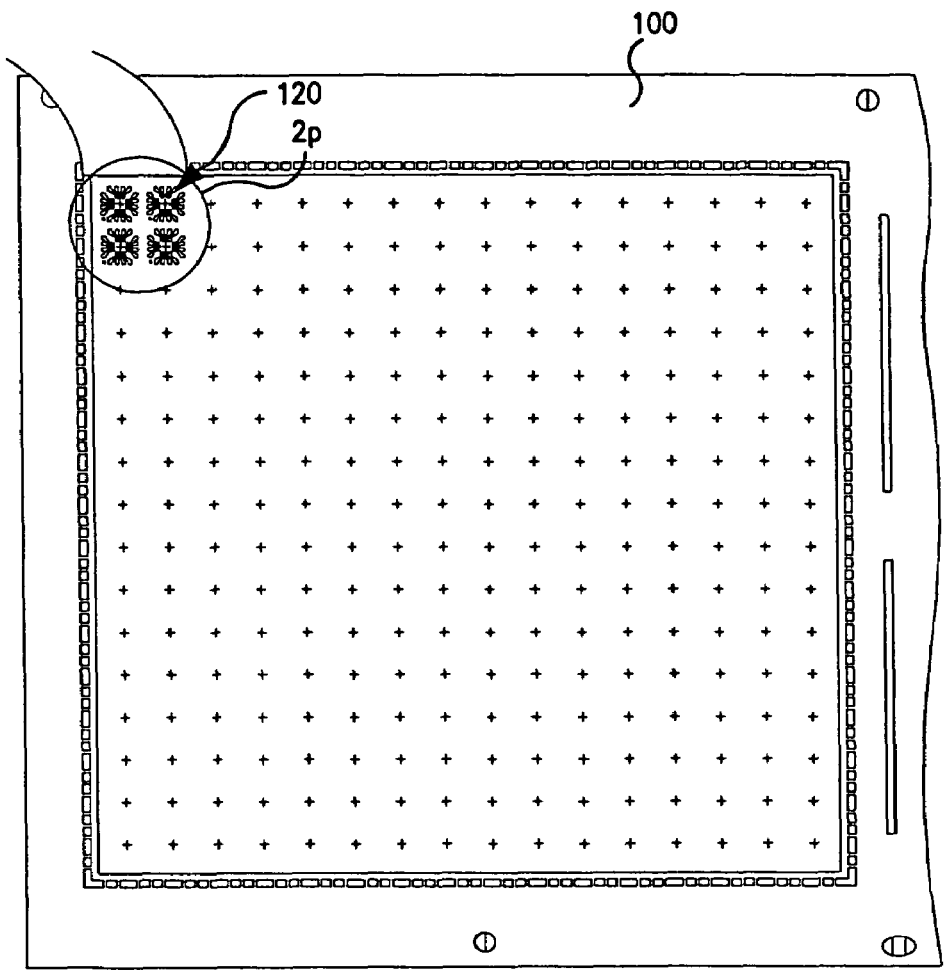
FIG. 2o is a top view of an array, or block, of taped lead frame chip sites, according to the present invention.
Figure 2P:
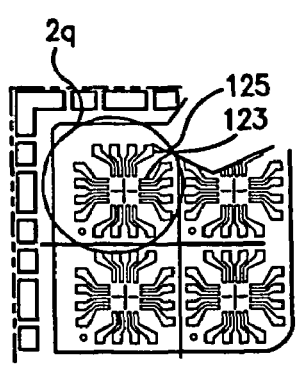
FIG. 2p is a portion of FIG. 2o, showing a better view of a plurality of chip sites, according to the present invention.
Figure 2Q:
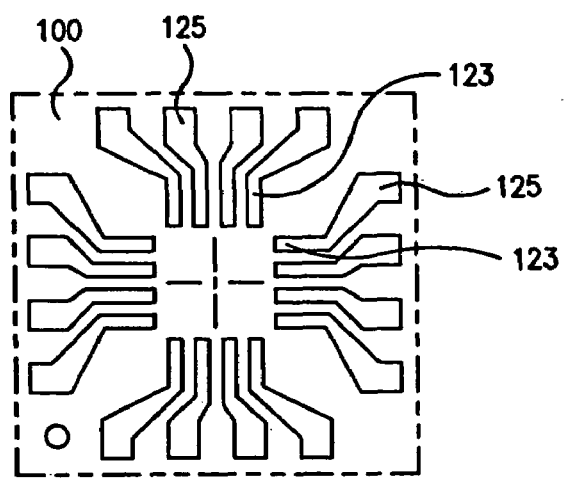
FIG. 2q is a further portion of FIG. 2m, showing a detailed top view of a chip site for a flip-chip, according to the present invention.
Figure 2R:
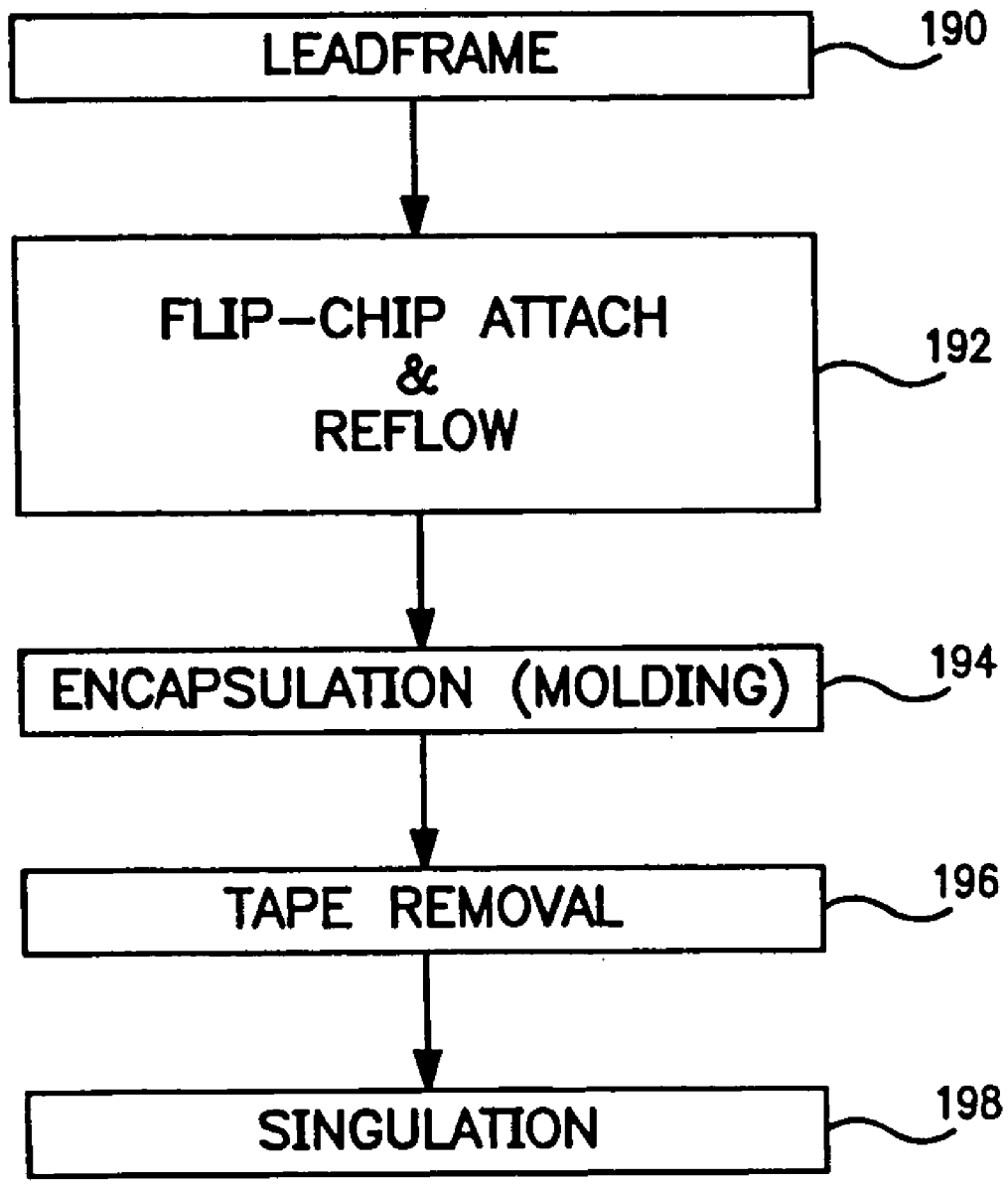
FIG. 2r is a flow chart showing the forming of a flip chip package, according to the present invention.

In another embodiment shown in FIGS. 2*a*-2*r*, a method of forming a taped lead frame for a flip-chip and a method of using the same for forming flip chip electronic packages are disclosed. Following process steps similar to those of the previous embodiment, a strip of metal film is attached to tape (100), as shown in FIG. 2*a*. The metal film is then patterned to form an array of lead frames with metal features forming chip sites (120), better seen in FIG. 2*b*. Features in this embodiment comprise a set of lead contacts (125). The contacts have short leads with ends (123), which extend inward towards the center of the lead frame. The ends of the short leads provide areas to join the bumps on a flip-chip, as shown at a later step. A cross-sectional view of the chip site in FIG. 2*b* is shown in FIG. 1*c*.

Tape carrier (100) is preferably POLYIMIDE, MYLAR, KAPTON, or Fr-4. Alternatively, an equivalent carrier that can be removed or disposed like glass-film or shiny plastic film, or similar, is used. The metal film, preferably copper, has a thickness between about 1 to 4 mils, and can have a thickness less than 1 mil. The metal film can be made as thin as possible as long as the metal is bondable. It is also preferred that the metal film is pre-plated, prior to mounting it onto the tape.

The patterning is accomplished by using photolithographic etching. The etching removes all metal until reaching the underlying tape, except for the features in the lead frames forming the chip sites. The lead frames are thus separated by streets (115) shown in FIGS. 2*a*, 2*h*, and 2*j*. The features of the lead frame are held in position by the underlying tape with connections neither between the lead frames nor between the features within a lead frame chip site. The absence of metal in the streets assures no sawing into any metal during the singulation process, as already disclosed in the previous embodiment. As in the previous embodiment, one can use a similar stiffener (130) behind the tape, as shown in FIG. 2c.

At the next step, chip (140) shown in FIG. 2d with solder bumps (145) is flipped over so that bumps (145) are placed over features (123) as shown in FIGS. 2e and 2f. A solder reflow operation is then performed and the solder bumps collapse somewhat forming shortened solder connections (150) as seen in FIG. 2g. The presence of the tape along with the stiffener provides the needed stability to form good flip-chip bonds as depicted in FIG. 2g.

After the flip-chips are attached and electrically connected to the lead frames, the lead frames on the tape are encapsulated in a molding material as shown in FIG. 2h. Encapsulant (160) is formed all around the chips as well as over all features in each lead frame chip site.

Once the encapsulant is cured and dried, the tape and optional stiffener are removed. The removal of the tape can be accomplished in any number of ways, as mentioned earlier. The resultant structure is an array, or matrix, of lead frame packages formed into a block, as shown in FIG. 2i. Because the lead frames in the block are electrically isolated from each other, block, or strip testing may be performed at this stage, prior to singulation. The block is then singulated at street portions (115) into a plurality of electronic packages (180) as shown in FIG. 2j. The bottom surface of each singulated package, shown in FIG. 2k, is clean and ready for further processing. The pre-plated contacts can be connected to the next level of packaging. If desired, the already clean contacts can be further smoothened out or flash soldered for improved connections.

FIGS. 2l, 2m and 2n show different types of electronic packages that can be obtained using the disclosed method of forming taped lead frame packages. FIG. 2l is an enlarged view of FIG. 2k, where cuts under the contact leads, called "lips" (127) can be better seen. The lips are formed by half-etching the extension of contact leads (125) from the bottom surface after the tape has been removed, and prior to encapsulation. This method prevents the lead/contact extension from being exposed to the bumped bond-pad location during encapsulation. Also, the lips capture and lock onto the molding material, thereby making it difficult for the molding material to separate from the mating surfaces. As a further locking mechanism, the vertical walls of the features can be patterned with reentrant features which will then hold onto the molding material, and prevent delamination at the metal-encapsulant interfaces. In a further embodiment, In FIG. 2m, dummy bumps (155) and pad (145) are used to provide a thermal path for thermal enhancement. Also, contacts (125) can be shortened as shown in FIG. 2n to provide a near chip size package.

FIG. 2o shows a top view of a block of taped lead frames for flip-chips. A portion of the block is shown in FIG. 2p, while a chip site is shown in FIG. 2q. A summary of the process steps for forming such packages is presented in FIG. 2r. Preferred steps comprise forming lead frame chip sites (190), followed by flip-chip placement and solder reflow (192). Next, encapsulation with a molding material is performed (194). Then, the tape backing, including the stiffener, if present, is removed at step (196) after which, the molded block is singulated (198) to form the individual flip chip packages.

Figure 3H:
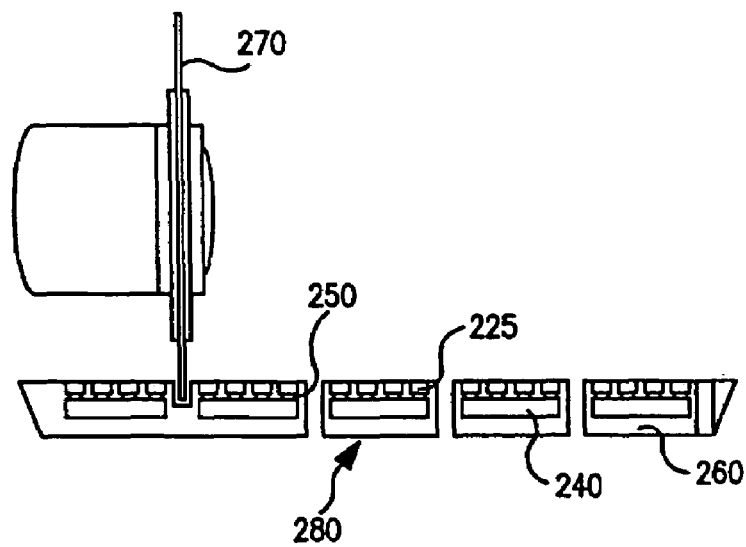
FIG. 3h is a cross-sectional view showing the singulation of the block of FIG. 3g where the saw does not encounter any metal portions of the lead frame in the streets, according to the present invention.
Figure 3I:
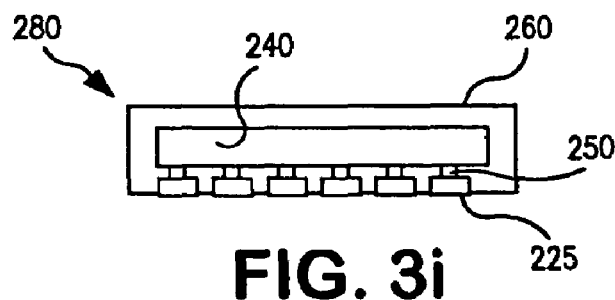
FIG. 3i shows a cross-sectional view of a singulated taped lead frame package with a land grid array flip-chip (TLGA), according to the present invention.
Figure 3J:
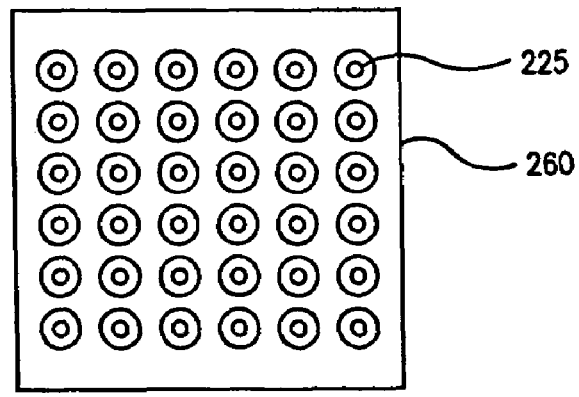
FIG. 3j is a bottom view of the land grid array package of FIG. 3i, according to the present invention.
Figure 3N:
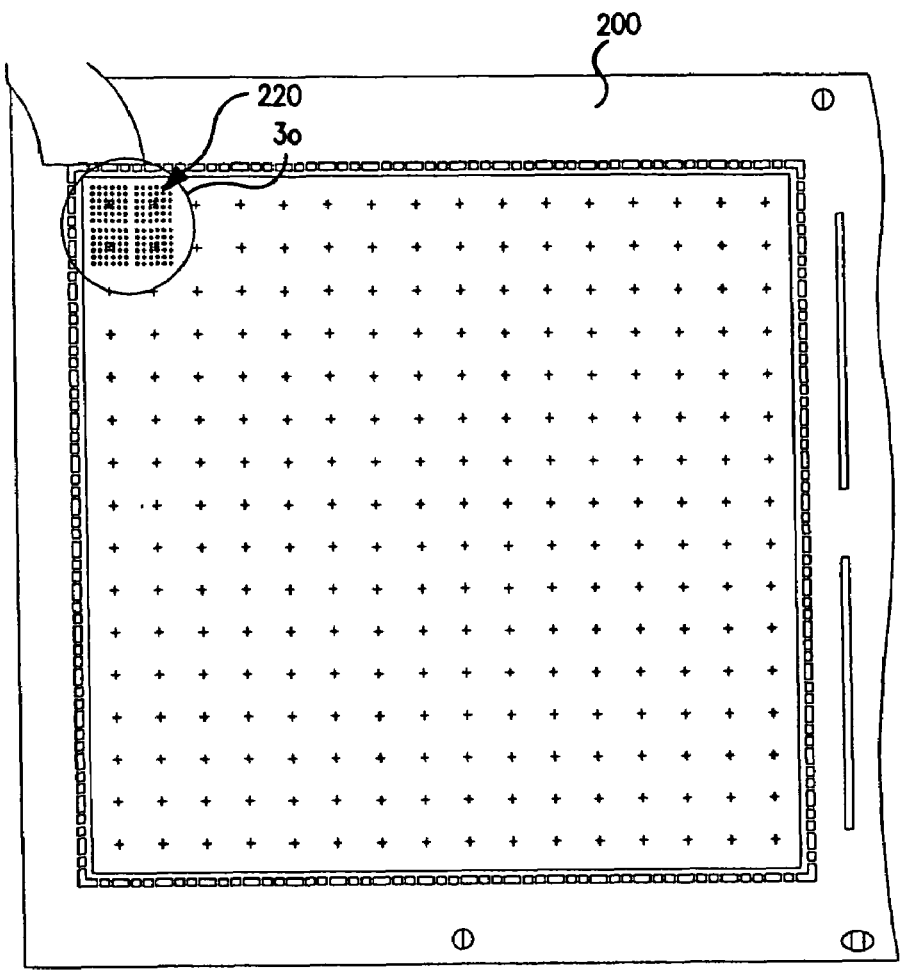
FIG. 3n is a top view of an array, or block, of taped lead frame chip sites to accommodate land grid array flip-chips, according to the present invention.
Figure 3O:
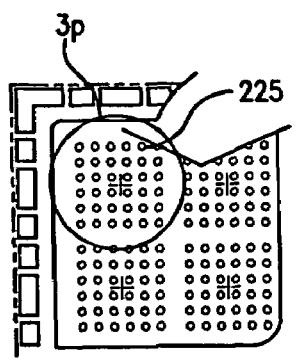
FIG. 3o is a portion of FIG. 3n, showing a better view of a plurality of chip sites, according to the present invention.
Figure 3P:
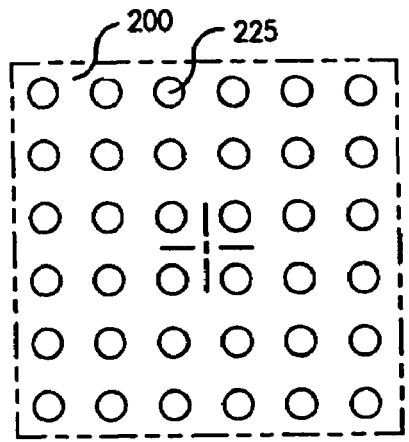
FIG. 3p is a further portion of FIG. 3o, showing a detailed top view of a chip site for a land grid array flip-chip, according to the present invention.
Figure 3Q:
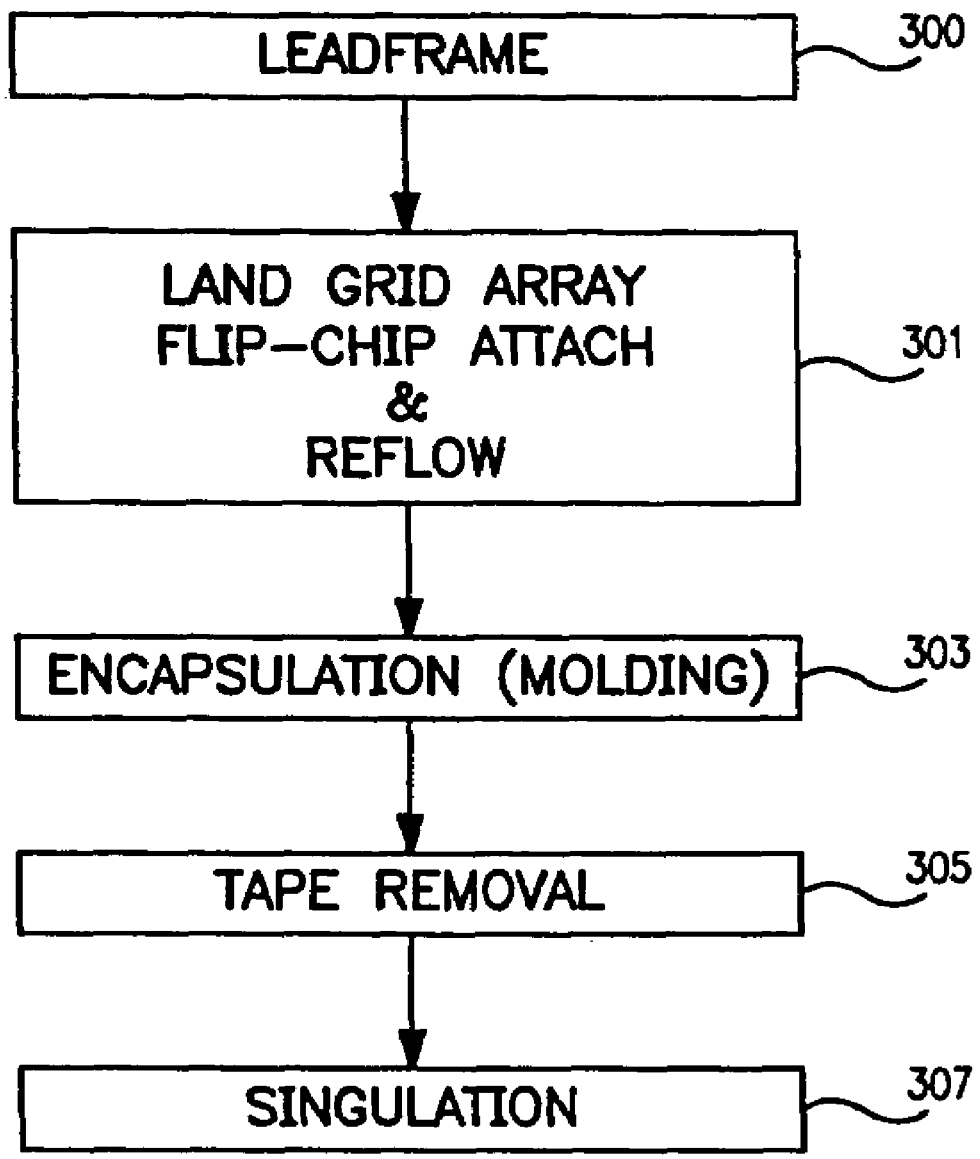
FIG. 3*q* is a flow chart showing the forming of a land grid array package, according to the present invention.

In the next embodiment shown in FIGS. 3a-3q, a method of forming a taped land grid array package and a method of using the same for forming land grid array electronic packages are disclosed. The process steps for the land grid array package follow very closely the process steps disclosed for the flip chip package. This embodiment leads to forming actual chip size packages with smaller footprints and more integrated features.

Namely, a strip of metal film is attached to tape (200) as in previous embodiments, and as shown in FIG. 3a. The metal film is then patterned to form an array of lead frames with features forming chip sites (220), better seen in FIG. 3b. Features in this embodiment comprise a set of round lead contacts (225). A cross-sectional view of the chip site in FIG. 3b is shown in FIG. 3c. FIG. 3c also shows optional stiffener (230).

The patterning is accomplished by using photolithographic etching. The etching removes all metal until reaching the underlying tape, except for the features in the lead frames forming the chip sites (220). The lead frames are thus separated by streets (215), while the features of the lead frame are held in position by the underlying tape.

At the next step, integrated circuit chips are attached and electrically connected to the lead frames. Chip (240) shown in FIG. 3d has a land grid array of solder bumps (245). The bumps are formed at spacings corresponding to the spacings between contacts (125) in each chip site (220). The chip is flipped over so that bumps (245) are placed over features (225) as shown in FIG. 3e. FIG. 3e shows two such chip sites with two solder bumped chips, but better seen in FIG. 3f. Solder reflow operation is performed causing the solder bumps to collapse somewhat and form shortened solder connections (250) as seen in FIG. 3f.

After the flip-chips are attached and electrically connected to the lead frames, the lead frames on the tape are encapsulated in a molding material as shown in the same FIG. 3f. Encapsulant (260) is formed all around and under the chips. The presence of the tape prevents the commonly encountered problem of mold flashing to the footprint on the underside of the package.

Once the encapsulant is cured and dried, the tape and optional stiffener are removed. The removal of the tape can be accomplished in any number of ways, including simply peeling it off, or dissolving chemically. The resultant structure is an array, or matrix, of lead frame packages formed into a block, as shown in FIG. 3g. The block is then singulated at street portions (215) into a plurality of electronic packages (280) as shown in FIG. 3h, without cutting into any metal.

An enlarged view of one of the packages is shown in FIG. 3i. The footprint of the package is very close to the footprint of the chip, except for the thickness of molding material (260) on the sides of the package. Solder bumps on the chip line up directly with features (225) that connect to the next level of packaging. This is better seen on the bottom view of the package shown in FIG. 3j. If desired, the already clean contacts can be further smoothed out or flash soldered for improved connections. Other examples of land grid array packages with a "lip" are shown in FIGS. 3k-3m. FIG. 3k shows a package with 256 lands while FIG. 3l shows a similar package with 144 lands. The package in FIG. 3m has 36 lands.

Similar to FIGS. 1l and 2o, FIG. 3n shows a top view of a block of taped lead frames for flip-chips with land grid array of bumps. A portion of the block is shown in FIG. 3o, while a chip site is shown in FIG. 3p. A summary of the process steps for forming a land grid array package is summarized in FIG. 3q. Preferred steps comprise forming taped lead frame chip sites (300), followed by land grid array flip-chip placement and solder reflow (301). Next, encapsulation with a molding material is performed (303). Then, the tape backing, including the stiffener, if present, is removed at step (305) after which, the molded block is singulated (307) to form the individual TLPF packages.

The invention enables the thickness of conventional lead frames to shrink significantly to result in thinner packages for improved heat dissipation and shorter geometries for improved electrical performance. It provides opportunities of mass production of extremely thin packages.

While the invention has been particularly shown and described with reference to particular embodiments, those skilled in the art will understand that various changes in form and details may be made without departing form the spirit and scope of the invention.

What is claimed is:

1. A method of forming a land grid array electronic package, comprising:

providing chips having solder bumps disposed in a land grid array;

providing a carrier which is a tape of plastics material or is a glass film, the carrier having attached thereto lead frames disposed in an array, each lead frame comprising a plurality of individual lead contacts of thickness not more than 100 μm (4 mil) arranged in a pattern corresponding to the land grid array of solder bumps and each electrically isolated from other metal features of the pattern, each lead frame being separated from adjacent lead frames by metal-free street regions on the carrier;

placing the chips on the carrier with the solder bumps over the lead contacts and performing a solder reflow operation to form connections between the chips and the lead contacts; encapsulating the lead frames and street regions of the carrier;

removing the carrier; and singulating the encapsulant to form the electronic packages without cutting into metal.

2. The method according to claim 1, wherein the carrier is a tape comprising POLYIMIDE, MYLAR, KAPTON, or Fr-4.

3. The method according to claim 1, wherein the metal features have a thickness of 25-100 μm (1-4 mils).

4. The method according to claim 1, wherein the metal features have a thickness of less than about 25 μm (1 mil).

5. The method according to claim 1, wherein the metal features are formed on the tape by photolithographic etching.

6. The method according to claim 1, wherein the metal features are plated, prior to attachment and electrical connection of the integrated circuit, with a wire-bondable and solderable composition.

7. The method according to claim 6, wherein the composition is Ni—Pd—Au-strike.

* * * * *